(12) United States Patent
Kano et al.

(10) Patent No.: US 6,917,021 B2
(45) Date of Patent: Jul. 12, 2005

(54) HEATING APPARATUS WITH ELECTROSTATIC ATTRACTION FUNCTION

(75) Inventors: Shoji Kano, Gunma (JP); Ryouji Iwai, Gunma (JP); Nobuo Arai, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/465,324

(22) Filed: Jun. 19, 2003

(65) Prior Publication Data

US 2003/0234248 A1 Dec. 25, 2003

(30) Foreign Application Priority Data

Jun. 20, 2002 (JP) ........................................ 2002-179475

(51) Int. Cl.$^7$ ............................................... H05B 3/10
(52) U.S. Cl. ..................... 219/548; 219/444.1; 219/544; 219/553; 361/234
(58) Field of Search ............................ 219/548, 444.1, 219/464, 544, 552–553; 361/234

(56) References Cited

U.S. PATENT DOCUMENTS

| | | | | |
|---|---|---|---|---|
| 5,606,484 A | * | 2/1997 | Kawada et al. | 361/234 |
| 5,665,260 A | * | 9/1997 | Kawada et al. | 219/467.1 |
| 5,748,436 A | * | 5/1998 | Honma et al. | 361/234 |
| 6,140,624 A | * | 10/2000 | Gilbert, Sr. | 219/553 |
| 6,242,719 B1 | * | 6/2001 | Kano et al. | 219/444.1 |
| 6,294,771 B2 | * | 9/2001 | Katsuda et al. | 219/544 |
| 6,384,383 B2 | * | 5/2002 | Kano et al. | 219/444.1 |
| 6,410,172 B1 | * | 6/2002 | Gilbert, Sr. | 428/698 |
| 6,423,615 B1 | * | 7/2002 | Ravi et al. | 438/458 |
| 6,462,928 B1 | * | 10/2002 | Shamouilian et al. | 361/234 |
| 6,490,146 B2 | * | 12/2002 | Wang et al. | 361/234 |
| 6,535,371 B1 | * | 3/2003 | Kayamoto et al. | 361/234 |
| 6,678,143 B2 | * | 1/2004 | Masuda et al. | 361/234 |

FOREIGN PATENT DOCUMENTS

| | | |
|---|---|---|
| JP | 52-067353 | 6/1977 |
| JP | 59-124140 | 7/1984 |
| JP | 04-124076 | 4/1992 |
| JP | 04-358074 | 12/1992 |
| JP | 05-109876 | 4/1993 |
| JP | 05-129210 | 5/1993 |
| JP | 07-010665 | 1/1995 |
| JP | 09-278527 | 10/1997 |
| JP | 2001015251 A | * 1/2001 |

OTHER PUBLICATIONS

Toshiya Watanabe, "Electrostatic Characteristics of Ceramic Electrostatic Chuck", New Ceramics No. 2, 1994, pp. 49–53.

* cited by examiner

Primary Examiner—Robin O. Evans
Assistant Examiner—Vinod Patel
(74) Attorney, Agent, or Firm—Hogan & Hartson, LLP

(57) ABSTRACT

There is disclosed a heating apparatus with electrostatic attraction function 1, comprising at least a supporting base 2, an electrode for electrostatic attraction 4 and a heating layer 5 that are formed on the supporting base, and an insulating layer 6 that is formed on the electrode for electrostatic attraction and the heating layer, wherein the electrode for electrostatic attraction and/or the heating layer are/is composed of pyrolytic graphite containing boron and/or boron carbide of 0.001–30% by weight in terms of boron concentration, and the insulating layer has an electric resistivity of $10^6$–$10^{15}$ Ωcm. There is provided a heating apparatus with electrostatic attraction function, which has a high thermal shock resistance, no problem of delamination, a proper resistance value, and a sufficient electrostatic attraction force even in a medium and high temperature range of 500–800° C., which causes no breakage of devices due to leakage current, and which can be used stably during rapid rise and rapid drop in temperature.

9 Claims, 1 Drawing Sheet

HEATING APPARATUS WITH ELECTROSTATIC ATTRACTION FUNCTION

BACKGROUND OF THE INVENTION

1. Field of the Invention

The present invention relates to a heating apparatus with electrostatic attraction function, and more particularly to a wafer heating apparatus with electrostatic attraction function, which is preferably used for a heating process of a semiconductor wafer during a fabrication process of semiconductor devices including a temperature rising process.

2. Description of the Related Art

For heating a semiconductor wafer during a fabrication process of semiconductor devices, a heater in which a metal-wire is wound was used conventionally. However, since there was a problem of metal contamination to a semiconductor wafer when this heater was used, in recent years there has been proposed using a wafer heating apparatus united with ceramics in which a ceramics thin film is used as a heating layer (for example, see Japanese Patent Laid-Open (Kokai) No. 4-124076).

Also, in the case of heating a semiconductor wafer, an electrostatic holding apparatus has been used to fix the semiconductor wafer on a heater in a reducing atmosphere, and its material has been shifted from resin to ceramics as the process has been performed at higher temperature (see Japanese Patent Laid-Open (Kokai) Nos. 52-67353 and 59-124140).

Further recently, there has been proposed a wafer heating apparatus having an electrostatic attraction function, in which the wafer heating apparatus united with ceramics and the electrostatic holding apparatus are combined. For example, in a low temperature range such as an etching process, an apparatus using alumina for an insulating layer of an electrostatic holding apparatus has been used (see New Ceramics (7), pp.49–53, 1994), and in a high temperature range such as a CVD process, an apparatus using pyrolytic boron nitride for an insulating layer of an electrostatic holding apparatus has been used (see Japanese Patent Laid-Open (Kokai) Nos. 4-358074, 5-109876, 5-129210, and 7-10665).

On the other hand, as described in the above reference (New Ceramics (7), pp.49–53, 1994), electrostatic attraction force is increased as volume resistivity (electrical resistivity) of an insulating layer is lowered, however, if too low, breakage of devices occurs due to leakage current. Therefore, it is considered that the volume resistivity of the insulating layer of the electrostatic holding apparatus is desirably $10^{10}$–$10^{13}$ Ωcm.

However, in the case of using alumina for the insulating layer in the above wafer heating apparatus with electrostatic attraction function, the resistance value becomes too low in a medium and high temperature range of 500–800° C., resulting in a problem that breakage of devices occurs due to leakage current. In addition, in the case of using pyrolytic boron nitride for the insulating layer, the resistance value becomes too high in the above medium and high temperature range, resulting in another problem that sufficient electrostatic attraction force can not be obtained.

In order to solve such problems, there has been proposed an electrostatic holding apparatus using pyrolytic boron nitride containing carbon of 1–20% by weight for its insulating layer (see Japanese Patent Laid-Open (Kokai) No. 9-278527), which has a proper resistance value and sufficient electrostatic attraction force even in the medium and high temperature range of 500–800° C.

However, in the above heating apparatus with electrostatic attraction function, since an insulating layer composed of pyrolytic boron nitride is bonded onto a heating layer and an electrode for electrostatic attraction which are composed of pyrolytic graphite, they are weakly bonded by Van der Waals forces, resulting in a problem that delamination occurs in the bonding boundary portion by repeated rise and drop in temperature.

On the other hand, since rapid rise and rapid drop in temperature are essential to increase the throughput of wafers, a heating apparatus having a high resistance to thermal shock has been required.

Therefore, there has been expected development of a wafer heating apparatus having high reliability, which has a high thermal shock resistance and no problem of delamination, and which has a proper resistance value and sufficient electrostatic attraction force even in the medium and high temperature range of 500–800° C.

SUMMARY OF THE INVENTION

The present invention has been accomplished to solve the above-mentioned problems. Namely, an object of the present invention is to provide a heating apparatus with electrostatic attraction function, which has a high thermal shock resistance, no problem of delamination, which has a proper resistance value and sufficient electrostatic attraction force even in the medium and high temperature range of 500–800° C., in addition, which causes no breakage of devices due to leakage current, and which can be used stably even during rapid rise and rapid drop in temperature.

In order to accomplish the above object, the inventors of the present invention performed various studies on heating apparatuses with electrostatic attraction function which can prevent decrease in electrostatic attraction force in the medium and high temperature range and delamination of a bonding boundary portion due to thermal shock and thus has a high electrostatic attraction force in the medium and high temperature range and high thermal shock resistance. As a result, it was found that if an electrode for electrostatic attraction and a heating layer, which were composed of pyrolytic graphite containing boron and/or boron carbide of 0.001–30% by weight in terms of boron concentration, were formed on a supporting base, and moreover an insulating layer, which has an electric resistivity of $10^6$–$10^{15}$ Ωcm, is formed thereon, there were obtained advantages that a high thermal shock resistance was realized, a sufficient electrostatic attraction force was obtained without causing decrease in electrostatic attraction force in the medium and high temperature range, in addition, temperature controllability was favorable because temperature dependency of resistivity of a heating layer was small, and thus obtained heating apparatus could be used stably over the long term. Consequently, the present invention was accomplished.

Namely, the present invention provides a heating apparatus with electrostatic attraction function, comprising at least a supporting base, an electrode for electrostatic attraction and a heating layer that are formed on the supporting base, and an insulating layer that is formed on the electrode for electrostatic attraction and the heating layer, wherein the electrode for electrostatic attraction and/or the heating layer are/is composed of pyrolytic graphite containing boron and/or boron carbide of 0.001–30% by weight in terms of boron concentration, and the insulating layer has an electric resistivity of $10^6$–$0^{15}$ Ωcm.

As described above, if the electrode for electrostatic attraction and the heating layer, which are composed of pyrolytic graphite containing boron and/or boron carbide of 0.001–30% by weight in terms of boron concentration, are formed on a supporting base and moreover the insulating layer having an electric resistivity of $10^6$–$10^{15}$ Ωcm is formed thereon, there can be obtained a heating apparatus with electrostatic attraction function that the electrode for electrostatic attraction and the heating layer have a high anchor effect, boron added to the electrode for electrostatic attraction and the heating layer is chemically bonded to nitrogen contained in the insulating layer, so that bonding between them is improved and thus the insulating layer has no problem of delamination, a proper resistance value and sufficient electrostatic attraction force are realized even in the medium and high temperature range of 500–800° C., and breakage of devices due to leakage current does not occur.

It is preferable that the electrode for electrostatic attraction and the heating layer are formed on a protective layer formed on the supporting base.

In this manner, if the electrode for electrostatic attraction and the heating layer are formed on the protective layer formed on the supporting base, contamination and the like due to such as impurities or gas contained in the supporting base can be prevented.

It is preferable that the supporting base is composed of any one of silicon nitride sintered body, boron nitride sintered body, mixed sintered body of boron nitride and aluminum nitride, alumina sintered body, aluminum nitride sintered body, and graphite.

The supporting base composed of such a material is desired because its physical properties are stable even in a medium and high temperature range of 500–800° C.

It is preferable that the protective layer is composed of any one of silicon nitride, boron nitride, aluminum nitride, and pyrolytic boron nitride.

If the protective layer composed of such a material is formed on the supporting base, it is stable even at a high temperature and its delamination almost never occurs.

It is preferable that the insulating layer is composed of any one of aluminum nitride, boron nitride, a mixture of aluminum nitride and boron nitride, pyrolytic boron nitride, pyrolytic boron nitride formed by adding carbon thereto, and pyrolytic boron nitride. formed by adding carbon and silicon thereto.

If the insulating layer is composed of such a material, it is strongly stuck and bonded onto the electrode for electrostatic attraction and the heating layer by anchor effect. Therefore, delamination of the insulating layer almost never occurs even if rise and drop in temperature are repeated, so that there can be provided the long-life heating apparatus with electrostatic attraction function.

Moreover, it is preferable that at least one of the protective layer, the electrode for electrostatic attraction, the heating layer, and the insulating layer is formed by a chemical vapor deposition method.

If each of them is formed by a chemical vapor deposition method as described above, it can be formed with a desired thickness and uniformity, so that generation of delamination and particles can be prevented. In particular, as to the electrode for electrostatic attraction and the heating layer, a pyrolytic graphite layer having a boron concentration of 0.001–30% by weight can be advantageously formed by a chemical vapor deposition method and can be processed to provide the electrode for electrostatic attraction and the heating layer which have a high anchor effect.

According to the heating apparatus with electrostatic attraction function of the present invention, the electrode for electrostatic attraction and the heating layer are formed of pyrolytic graphite containing boron and/or boron carbide of 0.001–30% by weight in terms of boron concentration, thereby a strong anchor effect is exerted, and no delamination of the insulating layer formed thereon occurs.

Moreover, since temperature dependency of resistivity of the heating layer is small, the heating apparatus also has the effect that temperature controllability is favorable.

Accordingly, there can be provided the heating apparatus with electrostatic attraction function that high thermal shock resistance is realized, delamination does not occur even if the rise and drop in temperature are repeated, it has a proper resistance value and sufficient electrostatic attraction force even in a medium and high temperature range of 500–800° C., breakage of devices due to leakage current does not occur, and it can be used stably even if the rise and drop in temperature are rapidly performed. Therefore, in a fabrication process of devices and the like, if wafers are heated by using this heating apparatus, its device yield is improved and also the apparatus can be used stably over the long term.

DESCRIPTION OF THE PREFERRED EMBODIMENT

An embodiment of the present invention will next be described in detail with reference to drawings.

Figure 1:
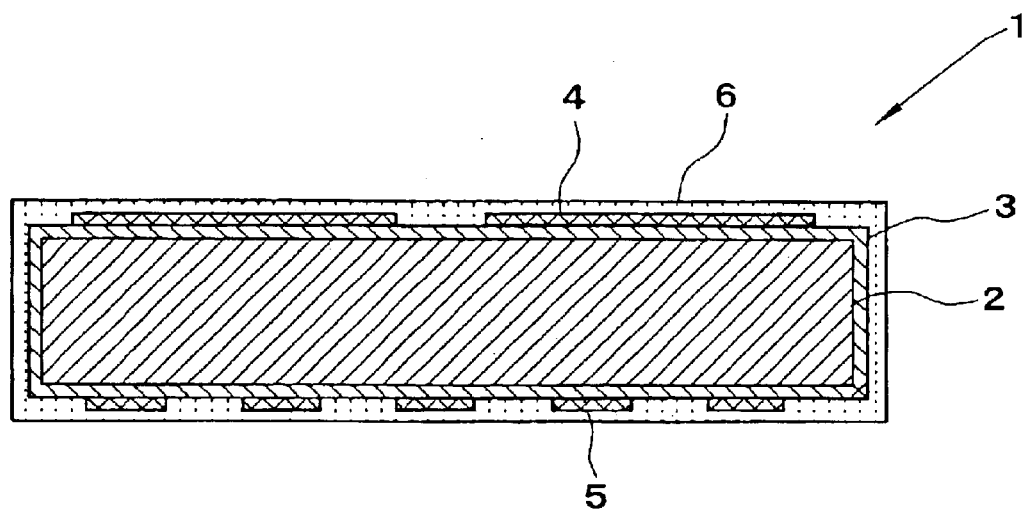
FIG. 1 is a schematic vertical cross-sectional view showing one example of a heating apparatus with electrostatic attraction function according to the present invention.

FIG. 1 shows one example of a heating apparatus with electrostatic attraction function according to the present invention. In the heating apparatus with electrostatic attraction function 1, an electrode for electrostatic attraction 4 and a heating layer 5 are formed on a protective layer 3 formed on a disc-shaped supporting base 2, and further an insulating layer 6 is formed on the electrode for electrostatic attraction 4 and the heating layer 5. Additionally, although not shown, power feeding terminals for electrostatic attraction and for the heating layer connected to an external power source are provided with the electrode for electrostatic attraction 4 and the heating layer 5, respectively, and electricity is supplied through the terminals to each of them.

In the case of heating a semiconductor wafer, the wafer is attracted and fixed on the insulating layer 6 formed on a front side of the supporting base 2 by the electrode for electrostatic attraction 4, and is heated by the conductive heating layer 5 formed on a back side of the supporting base 2.

Hereinafter, each component of the heating apparatus 1 will be explained concretely.

Although the material of the supporting base 2 is not limited particularly, it is desired that the supporting base 2 is composed of any one of silicon nitride sintered body, boron nitride sintered body, mixed sintered body of boron nitride and aluminum nitride, alumina sintered body, aluminum nitride sintered body, and graphite, because the physical properties are stable even in a medium and high temperature range of 500–800° C., in particular, graphite is stable up to a high temperature of 2000° C. or more.

The shape of the supporting base 2 is not limited particularly, for example, it may be circular plate shape, a columnar shape, a shape of circular plate or columnar with concave portions and convex portions, or the like.

The protective layer 3 formed on the supporting base 2 prevents impurities, gas and the like contained in the supporting base 2 from adversely affecting a subsequent fabrication process. Such a protective layer 3 is essential to secure insulation performance and also necessary to prevent oxidation in the case that the supporting base 2 is composed of graphite. On the other hand, if the supporting base 2 is an insulator, the protective layer 3 may be not necessarily formed thereon. However, it is preferable that the protective layer 3 is formed, because the layer can prevent contamination due to impurities and the like as described above.

It is preferable that the material of the protective layer 3 has stability up to a high temperature, for example, there can be used silicon nitride, boron nitride, pyrolytic boron nitride, and aluminum nitride.

Further, as for the thickness of the protective layer 3, if the layer is too thick, delamination occurs easily due to a difference in thermal expansion between the supporting base and the protective layer, and if too thin, impurities, gases and the like pass through pin holes of the layer, which may adversely affect a subsequent fabrication process. Therefore, the thickness of the protective layer is desirably 10–300 $\mu$m, in particular, 30–150 $\mu$m.

The electrode for electrostatic attraction 4 and the heating layer 5 are formed of pyrolytic graphite containing boron and/or boron carbide of 0.001–30% by weight in terms of boron concentration.

Thus formed electrode for electrostatic attraction 4 and heating layer 5 have an anchor effect. Therefore, the insulating layer formed thereon is stuck and bonded to them, and delamination of the insulating layer can be prevented even if rise and drop in temperature are repeated.

Further, the pyrolytic graphite containing boron and/or boron carbide within the above range has the property that reduces temperature dependency of resistivity. Thus, there is also an advantage that using the material for the heating layer makes the temperature controllability improved.

If the boron concentration is less than 0.001% by weight, there is a problem that the anchor effect can not be obtained, on the other hand if more than 30% by weight, there is another problem that the function as an electrode for electrostatic attraction or a heating layer can not be exerted because grain growth is too large to form a film.

Although each thickness of the electrode for electrostatic attraction 4 and the heating layer 5 is not limited particularly, it is desirably 10–300 $\mu$m, in particular, 30–150 $\mu$m. If the electrode for electrostatic attraction and the heating layer have the thickness of this range, an object to be heated such as a wafer can be electrostatically attracted and heated preferably.

Moreover, the insulating layer 6 formed on the electrode for electrostatic attraction 4 and the heating layer 5 has an electric resistivity of $10^6$–$10^{15}$ $\Omega$cm. If the insulating layer having the electric resistivity of this range is formed, the resistance in a medium and high temperature range of 500–800° C. becomes a proper value, breakage of devices due to leakage current does not occur, and sufficient electrostatic attraction force can be obtained.

Such an insulating layer 6 is preferably composed of any one of aluminum nitride, boron nitride, a mixture of aluminum nitride and boron nitride, pyrolytic boron nitride, pyrolytic boron nitride formed by adding carbon thereto, and pyrolytic boron nitride formed by adding carbon and silicon thereto.

Although the thickness of the insulating layer 6 is not limited particularly, it is desirably 50–500 $\mu$m, in particular, 70–150 $\mu$m.

In general, in the case that an insulating layer having a thickness of 50–500 $\mu$m is formed, if the surface to be bonded of the electrode for electrostatic attraction or the heating layer is smooth, the insulating layer would be easily delaminated due to a difference in coefficients of thermal expansion. However, in the present invention, since the electrode for electrostatic attraction 4 and the heating layer 5 which have an enhanced anchor effect are formed, delamination of the insulating layer 6 can be prevented even if the rise and drop in temperature are repeated.

Further, the insulating layer having the above described thickness has a sufficient insulating force and a proper electric resistivity even in the medium and high temperature range of 500–800° C., so that sufficient electrostatic attraction force can be maintained.

Although the production method of the heating apparatus with electrostatic attraction function according to the present invention is not limited particularly, the heating apparatus can be preferably produced by a chemical vapor deposition method.

For example, in the case of forming the electrode for electrostatic attraction and the heating layer, methane gas is reacted under the condition of 1000–2500° C. and 1–10 Torr in a reaction chamber, boron halide is introduced into the same reaction chamber in the range of 0.001–30% by weight as a boron concentration to form a pyrolytic graphite layer on a supporting base, for example, composed of graphite and having a protective layer on its surface. And then, this pyrolytic graphite layer is processed into a pattern for the electrode for electrostatic attraction 4 on a front side of the base and a pattern for the heating layer 5 on a back side thereof, respectively. In this manner, if the electrode for electrostatic attraction 4 and the heating layer 5, which are composed of the pyrolytic graphite containing boron and/or boron carbide of 0.001–30% by weight in terms of boron concentration, are formed by means of a chemical vapor deposition method, a fine roughness is formed on surface thereof, thereby the very high anchor effect can be exhibited, so that delamination of the insulating layer formed on them can be prevented effectively.

The protective layer and the insulating layer can also be formed in the same manner by a chemical vapor deposition method. Thus formed each layer has a high purity, and generation of delamination and particles can be suppressed.

Figure 2:
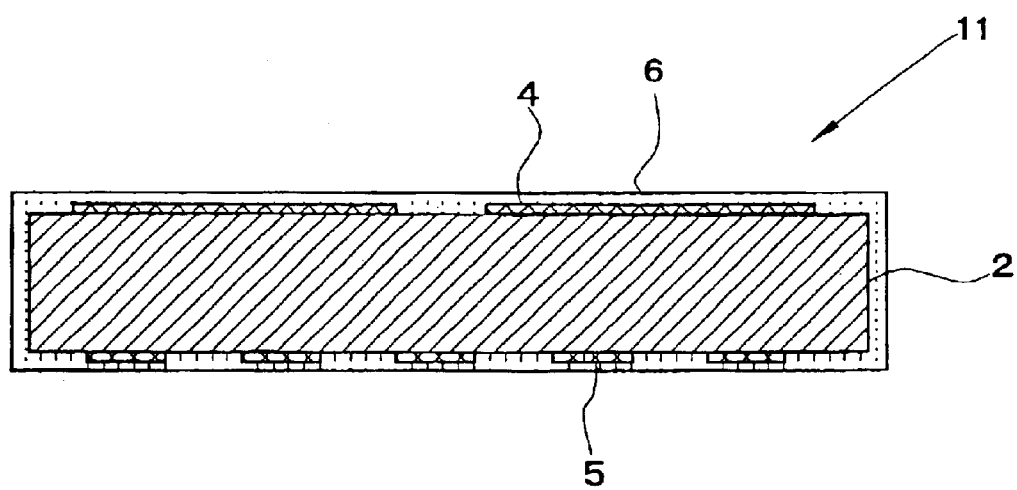
FIG. 2 is a schematic vertical cross-sectional view showing another example of a heating apparatus with electrostatic attraction function according to the present invention.

As described above, since the protective layer is not essential depending on the supporting base, in this case, the electrode for electrostatic attraction 4 and the heating layer 5 may be formed directly on the supporting base 2 as shown in FIG. 2. Thereby, there can be provided a heating apparatus with electrostatic attraction function 11, in which the other components are the same as shown in FIG. 1.

EXAMPLES

The present invention will now be described by way of example and comparative example concretely. However, the present invention is not limited thereto.

Example 1

A graphite base having a diameter of 200 mm and a thickness of 15 mm was prepared, and reaction of ammonia with boron trichloride was performed in a reaction chamber under the condition of 1800° C. and 100 Torr to form a protective layer composed of pyrolytic boron nitride on the base. Subsequently, on the protective layer, methane gas was pyrolyzed under the condition of 2200° C. and 5 Torr, and boron halide was introduced into the same reaction chamber in the range of 0.001–30% by weight as a boron concentration to form a pyrolytic graphite layer which has a thickness of 100 μm and in which boron and boron carbide were mixed. The front side of this pyrolytic graphite layer was processed into an electrode pattern to form electrode for electrostatic attraction, and the back side thereof was processed into a heater pattern to form heating layer. Moreover, on both surfaces thereof, reaction of ammonia, boron trichloride and methane was performed under the condition of 1600° C. and 5 Torr to form a carbon-containing pyrolytic boron nitride insulating layer having a thickness of 200 μm. Thereby, a wafer heating apparatus with electrostatic attraction function was manufactured. The electric resistivity of its insulating layer was $10^8$–$10^{13}$ Ωcm.

The test (test of rise and drop in temperature) was performed by repeating rise and drop in temperature 10000 times under the conditions that the temperature was increased from 100° C. to 1000° C. in one minute and decreased from 1000° C. to 100° C. in 5 minutes. As a result, no delamination was observed in bonded portions between the insulating layer and each of the electrode and the heating layer, and temperature distribution on a wafer at 500° C. was ±4° C., which does not changed.

Comparative Example 1

For comparison, a wafer heating apparatus with electrostatic attraction was manufactured in the same manner as in Example 1 except that methane gas was pyrolyzed in a reaction chamber under the condition of 2200° C. and 5 Torr and a pyrolytic graphite layer having a thickness of 100 μm was formed as electrode and heating layer without introducing boron halide into the same reaction chamber. The same test as above was performed on the obtained heating apparatus. Before the test, temperature distribution on a wafer at 500° C. was ±4° C., but in the test of the rise and drop in temperature, when the rise and drop in temperature were repeated about 500 times, delamination occurred and surface rose, so that it was impossible to hold a wafer thereon.

The present invention is not limited to the above-described embodiment. The above-described embodiment is a mere example, and those having the substantially same structure as that described in the appended claims and providing the similar action and effects are included in the scope of the present invention.

For example, the shapes of not only the supporting base but also the electrode for electrostatic attraction and the heating layer are not limited to those shown in FIGS. 1 and 2.

What is claimed is:

1. A heating apparatus with electrostatic attraction function, comprising at least a supporting base, a protective layer formed on the supporting base, an electrode for electrostatic attraction and a heating layer formed on the protective layer, and an insulating layer that is formed on the electrode for electrostatic attraction and the heating layer, wherein the electrode for electrostatic attraction and/or the heating layer are/is composed of pyrolytic graphite containing boron and boron carbide of 0.001–30% by weight in terms of boron concentration, and the insulating layer has an electric resistivity of $10^6$–$10^{15}$ Ωm.

2. The heating apparatus with electrostatic attraction function according to claim 1, wherein the supporting base is composed of any one of silicon nitride sintered body, boron nitride sintered body, mixed sintered body of boron nitride and aluminum nitride, alumina sintered body, aluminum nitride sintered body, and graphite.

3. The heating apparatus with electrostatic attraction function according to claim 1, wherein the protective layer is composed of any one of silicon nitride, boron nitride, aluminum nitride, and pyrolytic boron nitride.

4. The heating apparatus with electrostatic attraction function according to claim 2, wherein the protective Layer is composed of any one of silicon nitride, boron nitride, aluminum nitride, and pyrolytic boron nitride.

5. The heating apparatus with electrostatic attraction function according to claim 1, wherein the insulating layer is composed of any one of aluminum nitride, boron nitride, a mixture of aluminum nitride and boron nitride, pyrolytic boron nitride, pyrolytic boron nitride formed by adding carbon thereto, and pyrolytic boron nitride formed by adding carbon and silicon thereto.

6. The heating apparatus with electrostatic attraction function according to claim 2, wherein the insulating layer is composed of any one of aluminum nitride, boron nitride, a mixture of aluminum nitride and boron nitride, pyrolytic boron nitride, pyrolytic boron nitride formed by adding carbon thereto, and pyrolytic boron nitride formed by adding carbon and silicon thereto.

7. The heating apparatus with electrostatic attraction function according to claim 3, wherein the insulating layer is composed of any one of aluminum nitride, boron nitride, a mixture of aluminum nitride and boron nitride, pyrolytic boron nitride, pyrolytic boron nitride formed by adding carbon thereto, and pyrolytic boron nitride formed by adding carbon and silicon thereto.

8. The heating apparatus with electrostatic attraction function according to claim 4, wherein the insulating layer is composed of any one of aluminum nitride, boron nitride, a mixture of aluminum nitride and boron nitride, pyrolytic boron nitride, pyrolytic boron nitride formed by adding carbon thereto, and pyrolytic boron nitride formed by adding carbon and silicon thereto.

9. The heating apparatus with electrostatic attraction function according to any one of claims 1, 2, 3–4, 5, 6, and 7–8 wherein at least one of the protective layer, the electrode for electrostatic attraction, the heating layer, and the insulating layer is formed by a chemical vapor deposition method.

* * * * *